United States Patent
Su et al.

(10) Patent No.: US 6,919,825 B2
(45) Date of Patent: Jul. 19, 2005

(54) SPLIT RUNLENGTH ENCODING METHOD AND APPARATUS

(75) Inventors: Dongpei Su, Lomita, CA (US); Matthew R. Lipman, deceased, late of Hermosa Beach, CA (US); by Michele A. Lipman, legal representative, Hermosa Beach, CA (US); Raymond B. Robinson, Lawndale, CA (US)

(73) Assignee: Peerless Systems Corporation, El Segundo, CA (US)

( * ) Notice: Subject to any disclaimer, the term of this patent is extended or adjusted under 35 U.S.C. 154(b) by 95 days.

(21) Appl. No.: 10/672,426

(22) Filed: Sep. 25, 2003

(65) Prior Publication Data

US 2005/0068207 A1 Mar. 31, 2005

(51) Int. Cl.[7] ................................................. H03M 7/00
(52) U.S. Cl. .......................................... 341/50; 341/51
(58) Field of Search .................... 341/50, 51; 382/232, 382/245, 162, 167

(56) References Cited

U.S. PATENT DOCUMENTS

| | | | | |
|---|---|---|---|---|
| 4,409,621 A | * | 10/1983 | Richards et al. | 382/239 |
| 6,061,474 A | * | 5/2000 | Kajiwara et al. | 382/238 |
| 6,574,364 B1 | * | 6/2003 | Economidis et al. | 382/166 |

\* cited by examiner

Primary Examiner—Peguy Jeanpierre
Assistant Examiner—Joseph Lauture
(74) Attorney, Agent, or Firm—Blakely Sokoloff Taylor & Zafman

(57) ABSTRACT

The embodiments of the invention include a system and method for losslessly encoding and compressing a data stream. The data stream may be an image, text or combination of the two. The data stream may be received from a computer application or peripheral device. The encoding compresses the data stream by comparing consecutive values of the data stream and encoding the data based on the difference between consecutive data values.

23 Claims, 4 Drawing Sheets

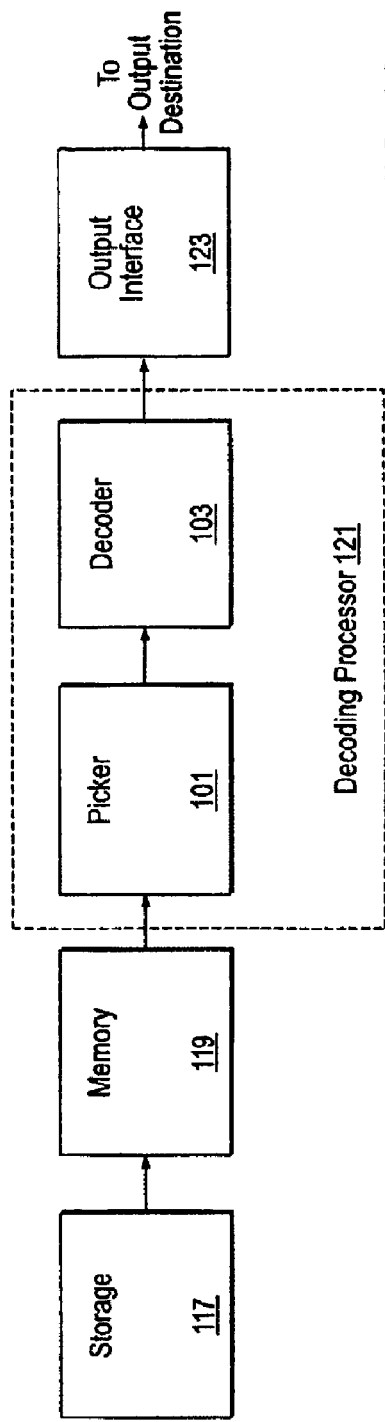
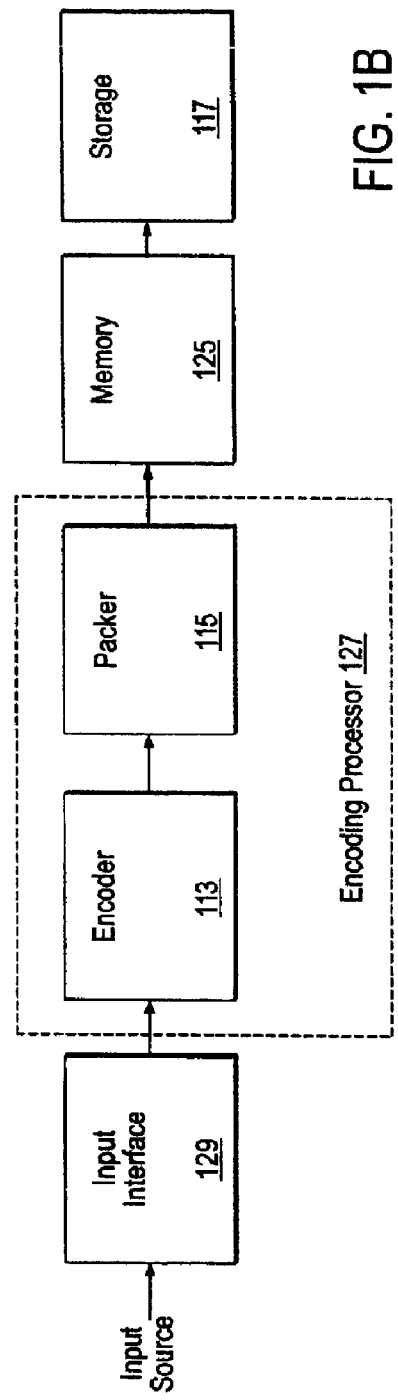

SPLIT RUNLENGTH ENCODING METHOD AND APPARATUS

BACKGROUND

1. Field of the Invention

The invention relates to lossless data compression and encoding. Specifically, the embodiments of the invention relate to compression that is based on encoding a stream of data based on the difference between consecutive values of the data stream.

2. Background

Printing devices encompass a wide variety of output display devices. These output display devices such as laser printers, bubble jet printers, plotters, image setters and other printing devices produce an image or visual representation on the surface of paper or similar materials. Many printing devices form images on a surface by printing dots corresponding to information contained in a bitmap or pixelmap. A raster printing device, for example, forms an image on a surface by printing dots arranged in rows and columns based upon a corresponding pixelmap.

Applications running on a computer system may generate a number of pages or images that are requested to be printed together. This collected group of images and pages is often referred to as a job. A number of jobs can often be requested in a period of time shorter than each job can be printed. These jobs are often queued to be printed after a previously scheduled job is completed. Jobs may be sent to an intermediate storage device where they are stored until they are sent to the printer.

Pages in a job are often described in a page description language (PDL) which is a high level language for describing objects to be displayed by an output device. These languages are usually interpreted languages that allow for an accurate representation of a page. The stream of data or files that represent a job or the components of a job such as pages, planes and bands are often of a large size. This causes slow transmission of the data and slow processing of the data due to its size.

BRIEF DESCRIPTION OF THE DRAWINGS

Embodiments of the invention are illustrated by way of example and not by way of limitation in the figures of the accompanying drawings in which like references indicate similar elements. It should be noted that different references to "an" or "one" embodiment in this disclosure are not necessarily to the same embodiment, and such references mean at least one.

FIG. 1A is a diagram of an exemplary decoding data path.

FIG. 1B is a diagram of an exemplary encoding data path.

DETAILED DESCRIPTION

Figure 2A:
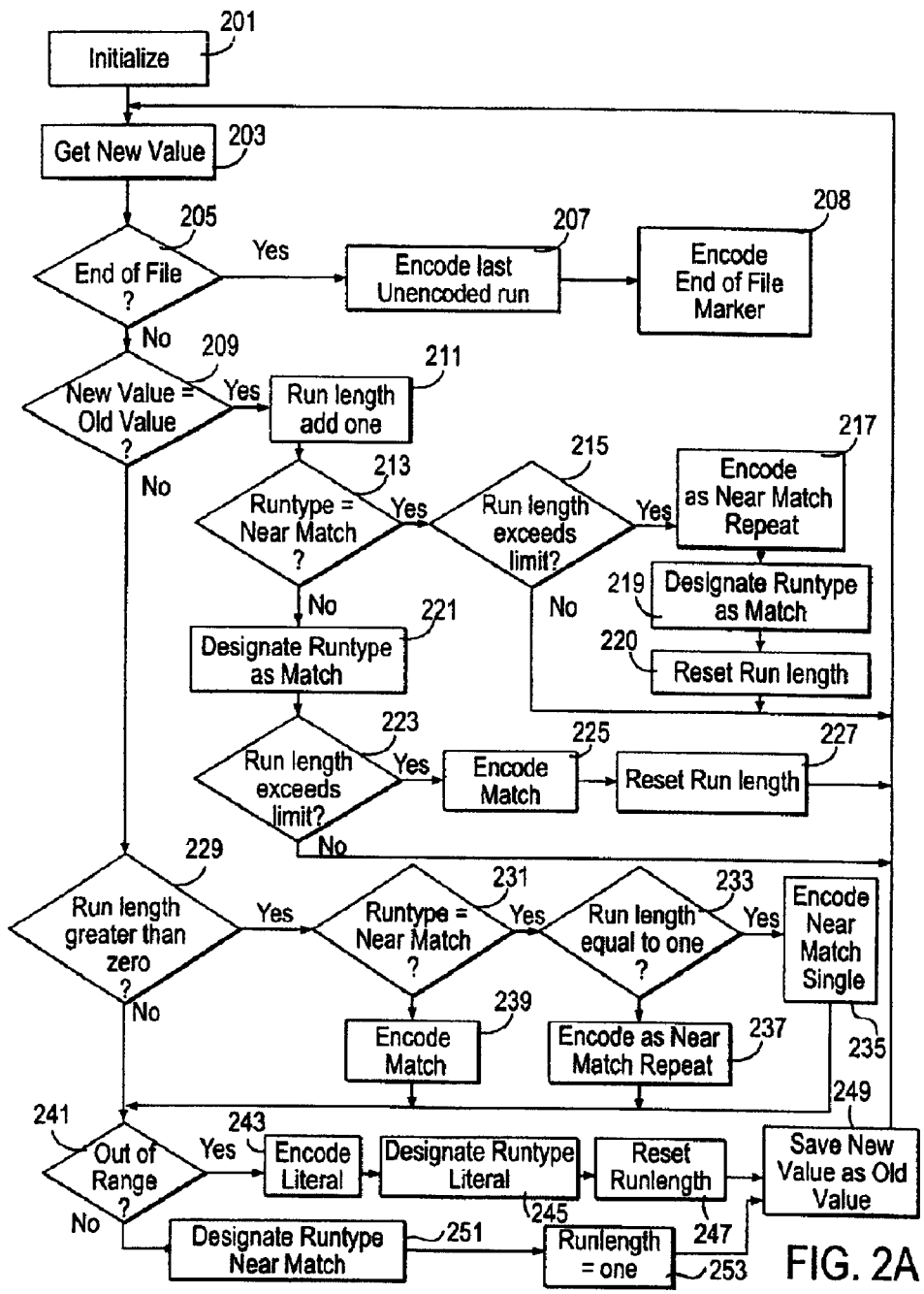
FIG. 2A is a flowchart of an encoding process.

FIGS. 1A and 1B are diagrams of exemplary encoding and decoding data paths. FIG. 1A illustrates a decoding data path where encoded data is retrieved from a file or similar data structure on storage device 117 and placed in memory 119. Storage 117 may be a fixed disk, removable media or similar storage device. Memory 119 may be a synchronous dynamic random access memory (SDRAM) or a similar device. Decoding processor 121 fetches the encoded data from memory 119. In one embodiment, decoding processor 121 may be a general purpose processor (GPP) running a software implementation of the decoding application. In another embodiment, decoding processor 121 is an application specific integrated circuit (ASIC). Decoding processor 121 includes a picker 101 and decoder 103. Picker 101 parses the words of encoded data from memory 119 and sends individual codes to decoder 103. Picker 101 may be a circuit or software executed by decoding processor 121. Decoder 103 may be a circuit or a software executed by decoding processor 121. Decoder 103 converts the codes into a stream of raster data or similar formatted data that is sent to output interface 105. Output interface 105 prepares and sends data to the output destination such as an application, storage or similar destination. In one embodiment, output interface 105 may be a print controller interface that translates the incoming stream of raster data into a set of signals that drive a print engine.

FIG. 1B illustrates an encoding data path where data is received as a stream from an input source, for example, a scanner engine or similar device. The stream of data is received over a medium, such as a universal serial bus (USB) or similar medium by input interface 129. Input interface 129 sends the data as a set of bytes or words to encoding processor 127. In one embodiment, encoding processor 127 may be a GPP executing a software implementation of the encoding application. In another embodiment, encoding processor 127 is an ASIC. Encoding processor 127 includes an encoder 113 and packer 115. Encoder 113 may be a circuit or software that encodes the bytes received from input interface 129 using a split run length encoding (SRLE) described below. The encoded data is then sent to a packer 115. Packer 115 may be a circuit or software that receives variable sized codes and forms words by stuffing codes into a word and breaking codes up over multiple words. The words of packed codes are then stored in memory 125 and subsequently sent to storage 117. Memory 125 may be an SDRAM or similar device. Storage 117 may be a fixed disk, removable media or similar storage device.

Multiple decoding and encoding processors (121, 127) may each be utilized in parallel data paths. In one embodiment, separate data paths may be used to handle bands, pages, or planes. For example, separate parallel data paths may be used for red, green and blue planes (RGB).

FIG. 2A is a flow chart of the SRLE encoding process used to encode the data stream by the encoding processors. In one embodiment, each incoming byte or unit of data is categorized, grouped and encoded as a Literal code, Near Match code, or Match code. Near Match codes may be further divided into Near Match Repeat codes and Near Match Single codes.

A Literal code is used to encode a single initial value and single values that deviate beyond a defined range from a previous value in a sequence of values in a data stream. For example if a range is defined as negative sixteen to positive fifteen or approximately an absolute value difference of fifteen or sixteen, then a value of fifty (decimal) would be encoded as a Literal if it followed a value of twenty. However, if the value fifty followed the value forty five it would not be encoded as a Literal because the difference, five, falls within the range of negative sixteen to positive fifteen.

A Near Match code is used to encode values that deviate within the defined range from a previous value in the sequence of the data stream. A Near Match code includes a runlength field in order to indicate the number of consecutive identical values that occur in a data stream. In one embodiment, a separate Near Match Single code having a smaller size than the generic Near Match code may be used as an optimization in terms of compression. The Near Match Single code does not have a runlength field making it smaller than the generic Near Match code that may have a runlength field of any size. In another embodiment, a Near Match Single code is not used and a Near Match Repeat code can encode a runlength of one. In one embodiment, the size of the runlength field is ten bits.

A Match code is used to encode values that are identical to the values that precede them in the sequence of the data stream. For example, if the values following a Literal are exactly the same, then a Match code is used. A Match code includes a runlength field in order to indicate the number of consecutive identical values that occur in the data stream. In one embodiment, the runlength field is ten bits. The runlength field size may be altered to handle longer or shorter runs.

In one embodiment, the encoding process begins by initializing a set of state variables (block 201). The state variables may include a run type variable that tracks a type of run that is currently being processed, a runlength variable that tracks the length of a current run (i.e., the number of identical consecutive values), and an 'old value' which tracks the preceding value that was processed. In this context a run is a set of values that can be encoded in a single code. The run types correspond to the types of possible encodings (e.g., Near Matches, Matches or Literals). The default old value may be zero or any other known value. The default runlength is zero.

The process continues by sequentially retrieving the next value in a data stream or the 'new value' (e.g., a byte) (block 203). The data stream may contain eight bit per pixel values (bpp). In another embodiment, the basic unit of encoding may be a word or a set of bits of any length. A determination may then be made as to whether the end of a file has been reached (block 205). If the end of file has been reached then any unencoded runs are encoded based on designated run types and calculated runlengths (block 207). An additional end of file code may be generated if the end of the file is detected (block 208).

If the end of a file is not detected, then new value is checked to determine if it is identical to the stored old value (block 209). If the new value is identical to the old value then the runlength is increased by one (block 211). The runlength variable acts as a tally to track the length of a run as each value in a data stream is processed. After the runlength tally has been increased then the run type is checked to determine if a near match has been designated for the current run (block 213). For example, if a sequence of values 0×20 0×26 0×26 (hexidecimal) occurs, the second value 0×26 starts a run of a near match. When the third value 0×26 is processed the runlength is increased by one. The run is not encoded until a change in value is detected or the runlength exceeds a fixed limit of encoding.

In one embodiment, if a near match has been designated then a check of the runlength is made to determine if the encoding limit has been reached (block 215). If the runlength has not exceeded its encoded limit then the next value is retrieved for processing (block 203). In one embodiment, the runlength is checked to determine if it has exceeded four.

If the runlength has exceeded four, then the run is encoded as a Near Match Repeat code (block 217). The run type is then designated as a match for any subsequent values that are also identical (block 219). A match run is designated if a value in a sequence is an exact match with a preceding value that was encoded as a Literal or, in circumstances where runlengths are finite, a Near Match Repeat. The runlength is then reset to zero (block 220). The next value can then be retrieved for processing (block 203). The check for the runlength of four and encoding of the Near Match Repeat code is based on a Near Match Repeat code that only has two bits for encoding the runlength. In another embodiment, the Near Match Repeat code may have a larger or smaller bit length allowing for the encoding of different sizes of runlength. The check for runlength would be adjusted accordingly to the number of bits for the runlength field. In a further embodiment, the Near Match Repeat code may be structured to handle any size of runlength.

In the instance where the new value is equal to the old value (block 209) and the run type is not a near match (block 213) then a run type of match is designated (block 221). In one embodiment, if a match has been designated then a check of the runlength is made to determine if the encoding limit has been reached (block 223). If the runlength has not exceeded its encoded limit then the next value is retrieved for processing (block 203). In one embodiment, the runlength is checked to determine if it has exceeded 1027. If the runlength has exceeded 1027, then the run is encoded as a Match code (block 225). The runlength is then reset to zero (block 227). The next value can then be retrieved for processing (block 203). The check for the runlength of 1027 and encoding of the Match code is based on a Match code that only has ten bits for encoding the runlength. In another embodiment, the Match code may have a larger or smaller bit length allowing for the encoding of different sizes of runlength. The check for runlength would be adjusted accordingly to the number of bits for the runlength field. In a further embodiment, the Match code may be structured to handle any size of runlength.

In an instance where the new value does not equal the old value (block 209), then a check is made to determine if the runlength is greater than zero (block 229). A runlength greater than zero indicates that an unencoded run has ended because a change in value has occurred. A check of the run type is made to determine if the run is a near match run (block 231). If the run was not a near match run then it is encoded as a Match code (block 239). If the run is a near match then a check is made to determine if the runlength was equal to one (block 233). If the runlength is equal to one then the run is encoded as a Near Match Single code (block 235). If the runlength is not equal to one then the run is encoded as a Near Match Repeat code (block 237). In another embodiment, a Near Match Single code may not be used and all runs that are not a match are encoded as a Near Match code. Regardless of the encoding of the run (Match, Near Match Repeat or near Match Single), processing continues because the encoding of the run does not include the new value. The new value indicated the end of a run by deviating from the old value.

In an instance where a new value is not equal to the old value (block 209), the new value is compared to the old value to determine if the difference falls within the predefined range (block 241). In an embodiment, using eight bpp values a range of negative sixteen to positive fifteen may be used. This range determines if the lower order bits have changed in the new byte from the low order bits in the previous byte. In the case where the first value of a stream is being analyzed then a default known old value may be used. For example the default value may be zero. If the difference is out of range then the value is encoded as a Literal (block 243) and the run type is designated as literal (block 245). For example, an initial value of a data stream may be 0x20. If the default old value is zero then the value of 0x20 is encoded as a Literal. The runlength is reset to zero because the last retrieved value in the current run has been encoded and the next value to be retrieved will start the next run (block 247).

However, if the difference is in the predefined range then the run type is designated as a near match (block 251). Designating a run as a near match is a categorization that identifies that a current sequence of values being analyzed is to be encoded as a Near Match and that the length of the run must be determined before the encoding can complete. The runlength for the near match is set to one because the current run includes the last retrieved value (block 253). In either case, (encoding as a literal or designation as a near match) the new value is saved as the old value (block 249) before the next value is retrieved (block 203) and the processing of the data stream continues.

Figure 2B:
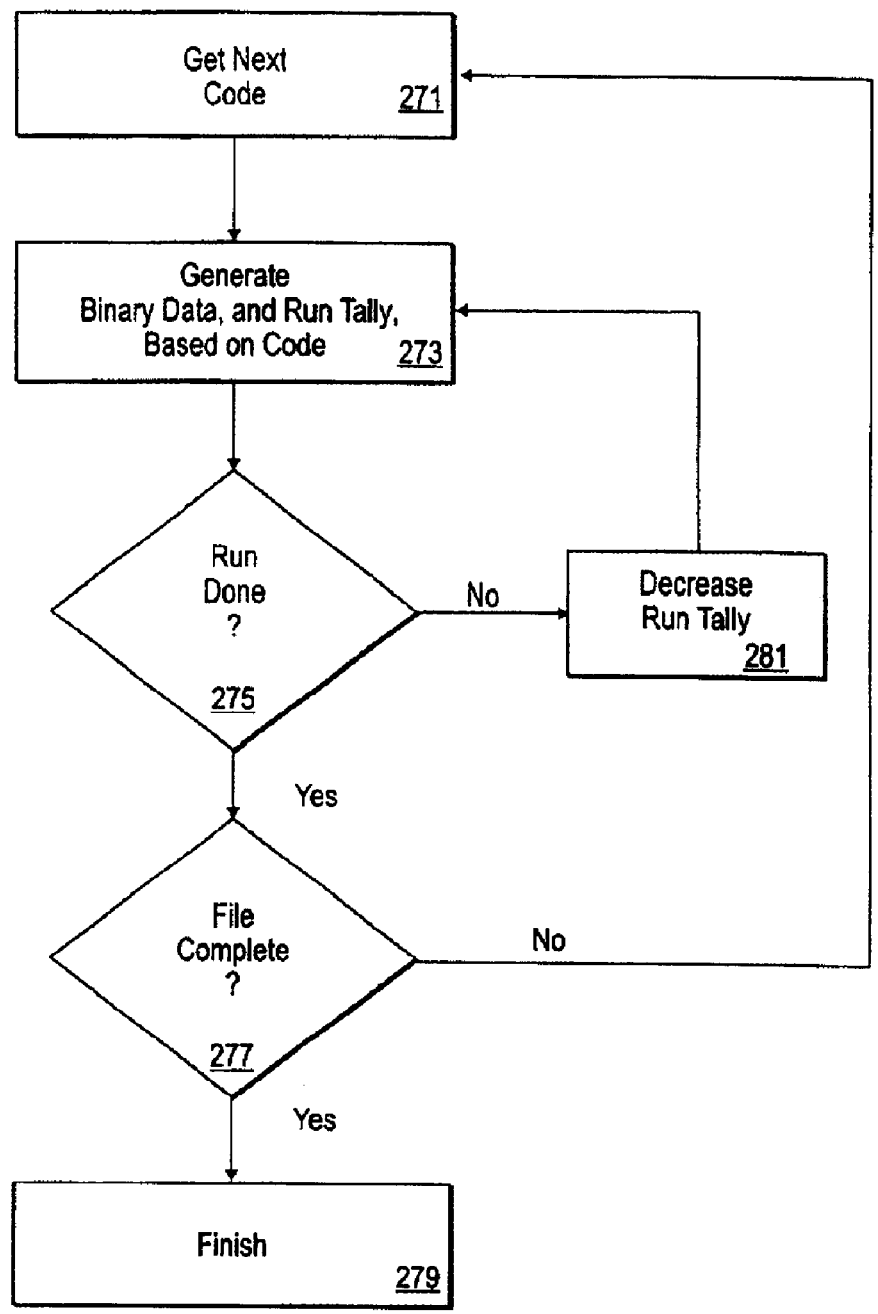
FIG. 2B is a flowchart of a decoding process.

In one embodiment, the encoding scheme in the flowchart of FIG. 2A is a first encoding mode that is used to encode a stream of data. The first encoding process is optimized for high resolution original image data. The first encoding process may be the default process. Data encoded using this first encoding mode may be decoded using a simple decoding process shown in the flowchart of FIG. 2B. The decoding process begins by obtaining the next code to be decoded (block 271) and generates the binary value derived from the code (block 273). Literals contain the exact binary value. Near Match codes indicate the difference between the binary value to be generated and the preceding binary value that was generated. Match codes indicate that the binary value to be generated is identical to the preceding binary value. The decoding process determines if the run is complete by checking the runlength of the code that is being evaluated (block 275). If the run is not complete the decoding process decreases the runlength (block 281) and generates the next value (block 273). When the run is completed the process checks for the end of file code (block 277). If the end of file has not been reached then the next code to be evaluated is retrieved (block 271). If the end of file is found then the decoding process is complete (block 279).

In one embodiment, a second encoding process may be utilized in conjunction with the first encoding process described above in connection with FIG. 2A. The second encoding process may be used for data streams that are known to contain many long runs of values. For example the second encoding process may be used for images that contain many long runs of identical pixels. In one embodiment, the second encoding process is used with data that has been filtered. The second process encodes the full value of a pixel, byte or unit of data along with the runlength for the number of identical values that immediately follow it. The first encoding method (i.e., SRLE encoding) and the second encoding method include codes that indicate a switch to the other mode. This enables an encoder to encode a document using both encoding processes according to the type of data or known properties of a document. Switching between the first process and the second process can be done adaptively by an encoder within a scanline, from scanline to scanline or from band to band as needed. This enables improved compression ratios while preserving image quality. The switch codes allow a decoder to easily detect the switch in encoding processes to decode a file or data stream quickly. In another embodiment, other encoding processes may be utilized as the second encoding method. Other second encoding methods include the use of TIFF, JPEG and similar algorithms.

The first and second encoding systems may be used with documents that are segmented into planes (e.g., cyan, yellow, magenta and black planes), bands or similar structures. The first and second encoding systems may also be used with object oriented documents and files where the encoding is used primarily on the data associated or encapsulated by the files or interpretations of such files. Both processes of encoding are lossless.

The first encoding system may achieve compression ratios between 513.5:1 and 0.8:1 (i.e. a ratio of compression of 513.5:1 between the compressed file and the original file). The compression ratio for a file of a photograph having 600 dots per inch (dpi) averages between two and six to one. The compression ratio for a file containing text averages greater than thirty to one. The compression ratio for a file containing line art averages greater than ten to one. The second encoding system may achieve compression ratios between 391.2:1 and 0.73:1. The compression ratio for a file of a photograph having 600 dpi averages between three and ten to one. The compression ratio for a file containing text averages greater than thirty to one. The compression ratio for a file containing line art averages greater than thirty to one.

Figure 3A:
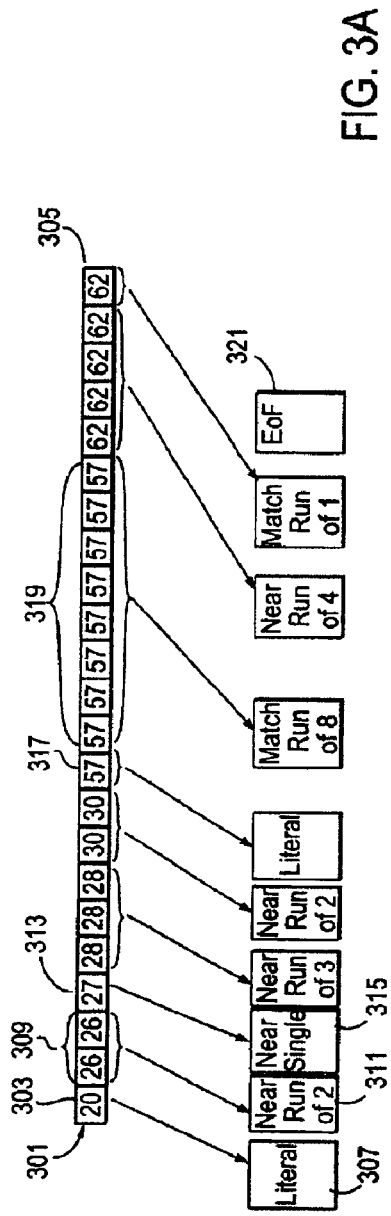
FIG. 3A is a diagram of an exemplary categorization.

FIG. 3A is an exemplary coding and data stream. A data stream 301 is composed of a series of consecutive bytes. The bytes are written in hexidecimal. First byte 303 is 0x20 and last byte 305 is 0x62. The bytes are processed in sequential order. First byte 303 is encoded as a literal 307. In one embodiment, there is no previous value and first byte 303 must be categorized as a literal. In another embodiment, the encoding processor utilizes a known default starting value and the first actual value is categorized in relation to the default value.

The next two bytes 309 in the data stream are both 0x26. The first is categorized as a near match because the difference in value with the preceding value 0x20 falls within the defined range of negative sixteen to positive fifteen (i.e., 6). The next value is also 0x26. This value is grouped with the previous value and a categorization is finalized as a near match with a run of two bytes 311. The next byte 313 is categorized as a near match single 315 because the following bytes do not have a matching value. Byte 317 has a value of 0x57. This byte has a difference in value from the preceding byte that falls outside of the defined range. Byte 317 is encoded as a literal. The subsequent set of bytes 319 having the value 0x57 are encoded as a match with a run of eight. A special end of file code 321 is generated at the end of the file.

Figure 3B:
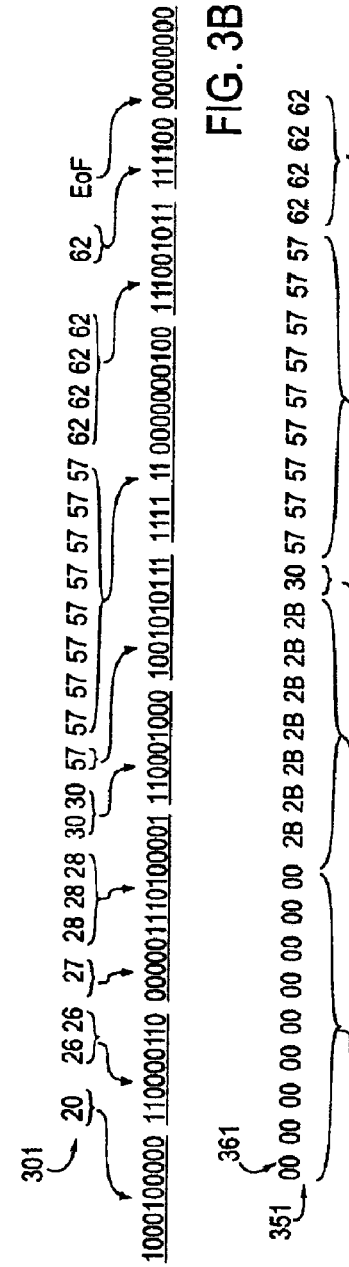
FIG. 3B is a diagram of an exemplary encoding.

FIG. 3B is an exemplary encoding of data stream 301. This encoding utilizes the op codes and format of Table I. One skilled in the art would appreciate that other codes may be used for categorizing data into the base categories of literals, near matches, matches and special escape codes. All values are in binary. An opcode identifies the type of categorization of the data. The runlength field associated with an opcode identifies the number of consecutive values for the category. The value field is the actual value of the encoded sequence or the difference in value from the previous encoding. The field length for a literal is based on encoding eight bit per pixel data. This field size may be adjusted to reflect the bit per pixel size of data to be encoded. The field size of the near match opcodes is based on the range that identifies this category of data. The field length can be adjusted if a wider or narrower range is utilized.

TABLE I

| Type | Opcode | Runlength | Value Field Length |
|---|---|---|---|
| Literal | 10 | | xxxxxxxx (8) |
| Near Match Single | 0 | | xxxxx (5) |
| Near Match Repeat | | | |
| with run of 2 | 11 | 00 | xxxxx (5) |
| with run of 3 | 11 | 01 | xxxxx (5) |
| with run of 4 | 11 | 10 | xxxxx (5) |
| Match | | | |
| with run of 1 | 1111 | 00 | |
| with run of 2 | 1111 | 01 | |
| with run of 3 | 1111 | 10 | |
| with run of 4 | 1111 11 | 0000000000 | |
| with run of 5 | 1111 11 | 0000000001 | |
| ............ | | | |
| with run of 1027 | 1111 11 | 1111111111 | |
| End of File | 0 00000 00 | | |
| Switch Mode | 0 00000 11 | | |

Figure 3C:
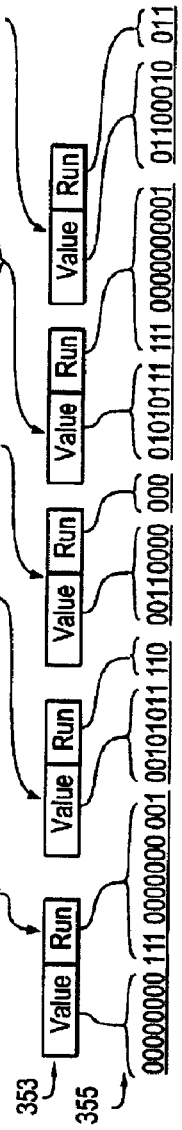
FIG. 3C is a diagram of an exemplary second mode of encoding.

FIG. 3C is a diagram of an exemplary second mode of encoding a stream of data. The second mode of encoding is optimized for data with long runs of identical values. Data stream 351 is parsed into a set of value and runlength pairs 353. The value of each pair is the value of the sequence and runlength is the number of consecutive appearances for the value. The first value 361 of data streams 351 is 0×00. There are eight consecutive values that match. Exemplary encoding stream 355 is the binary representation of the value and runlength pairs 353. The encoding is based on the exemplary encoding scheme where the first eight bits represent the value encoded and the next three bits represent the length of the run or indicate that a long run is encoded in the subsequent ten bits (i.e., 0b000-0b110, binary values, encode runlengths of one through seven, while 0b111, a binary value, indicates that the next ten bits encode runs of eight to one thousand and twenty seven in length). One of ordinary skill in the art would understand that other similar encoding schemes may be used to represent the runlength. For example more than three or ten bits may be used to indicate the runlength, or a single run field length may be used. The second mode may also have reserved values to indicate an end of file (e.g., xxxxxxxx 111 1111111100, a binary value) or a mode of encoding a switch (e.g., xxxxxxxx 111 1111111111, a binary value).

In the foregoing specification, the invention has been described with reference to specific embodiments thereof. It will, however, be evident that various modifications and changes can be made thereto without departing from the broader spirit and scope of the invention as set forth in the appended claims. The specification and drawings are, accordingly, to be regarded in an illustrative rather than a restrictive sense.

What is claimed is:

1. A method comprising:
   comparing the value of a set of data with a previous value;
   encoding the set of data with a first code if the difference is outside a range;
   encoding the set of data with a second code if the value of the set of data does not match the previous value but is within the range; and
   encoding the set of data with a third code if the value of the first set of data does match the previous value.

2. The method of claim 1, wherein the first code includes the actual value of the set of data.

3. The method of claim 1, wherein the second code includes the difference and a number of identical sequential values.

4. The method of claim 1, wherein the third code indicates a match and a number of identical sequential values.

5. The method of claim 1, wherein the encoding of the first set of data with one of the first code, second code and third code is lossless.

6. The method of claim 1, further comprising:
   encoding the set of data with a fourth code if the value is within the first range and a subsequent value does not match the value of the first set of data.

7. The method of claim 1, wherein the range is optimized to encode the set of data that includes an eight bit pixel.

8. The method of claim 1, further comprising:
   switching to an alternate mode of encoding.

9. An apparatus comprising:
   a processor to encode a stream of data including a first value and a second value, the processor comparing the first value to the second value of data to determine a difference, the processor to encode the second value with a first code if the difference is zero, a second code if the difference is in a range and a third code if the difference is outside the range.

10. The apparatus of claim 9, further comprising:
    a first device coupled to the processor to segment the data stream of codes received from the processor into a set of words.

11. The apparatus of claim 9, wherein the processor is an application specific integrated circuit.

12. The apparatus of claim 9, further comprising:
    a memory device to store the stream of data.

13. The apparatus of claim 12, further comprising:
    a first device coupled to the processor to parse a word from the stream of data to output to the processor.

14. The apparatus of claim 12, wherein the processor is a general purpose processor.

15. An apparatus comprising:
    a processor to decode a data stream, the processor to generate a binary output from the data stream including a set of opcodes that encode the data stream where a first opcode identifies a literal value, a second opcode identifies a set of matching values, a third opcode identifies a set of matching values and a difference value.

16. The apparatus of claim 15, further comprising:
    a memory device to store the stream of data.

17. An apparatus comprising:
    means for comparing the value of a set of data with a previous value;
    a means for encoding the set of data with a first code if the difference is outside a range;
    means for encoding the set of data with a second code if the value of the set of data does not match the previous value but is within the range; and
    means for encoding the set of data with a third code if the value of the set of data does match the previous value.

18. The apparatus of claim 17, further comprising:
    means for encoding the set of data with a fourth code if the value is within the first range and a subsequent value does not match the value of the set of data.

19. The apparatus of claim 17, wherein the range is optimized to encode the set of data that includes an eight bit pixel.

20. The apparatus of claim 17, further comprising:
means for switching to a mode of encoding optimized for a stream of data having long runs of identical pixels.

21. A machine readable medium, having stored therein a set of instructions, which when executed cause a machine to perform a set of operations comprising:
comparing the value of a set of data with a previous value;
encoding the set of data with a first code if the difference is outside a range;
encoding the set of data with a second code if the value of the set of data does not match the previous value but is within the range; and
encoding the set of data with a third code if the value of the first set of data does match the previous value.

22. The machine readable medium of claim 21, having further instructions stored therein, which when executed cause a machine to perform a set of operations, further comprising:
encoding the set of data with a fourth code if the value is within the first range and a subsequent value does not match the value of the first set of data.

23. The machine readable medium of claim 21, having further instructions stored therein, which when executed cause a machine to perform a set of operations, further comprising:
switching to an alternate mode of encoding.

* * * * *